United States Patent
Cao et al.

(10) Patent No.: US 12,158,653 B2
(45) Date of Patent: Dec. 3, 2024

(54) COLOR FILTER SUBSTRATE, DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Ming Xu, Guangdong (CN); Lixuan Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,642

(22) PCT Filed: Apr. 13, 2022

(86) PCT No.: PCT/CN2022/086596
§ 371 (c)(1),
(2) Date: May 29, 2022

(87) PCT Pub. No.: WO2023/184578
PCT Pub. Date: Oct. 5, 2023

(65) Prior Publication Data
US 2024/0160061 A1    May 16, 2024

(30) Foreign Application Priority Data

Mar. 31, 2022    (CN) .......................... 202210343228.5

(51) Int. Cl.
*G02F 1/1335* (2006.01)
*G02F 1/13* (2006.01)
(Continued)

(52) U.S. Cl.
CPC ...... *G02F 1/133514* (2013.01); *G02F 1/1326* (2013.01); *G02F 1/133512* (2013.01);
(Continued)

(58) Field of Classification Search
CPC ............. G02F 1/133514; G02F 1/1326; G02F 1/133512; G02F 1/133553; H10K 59/50; H10K 59/38; H10K 59/126; H10K 59/878
See application file for complete search history.

(56) References Cited

U.S. PATENT DOCUMENTS

| | | | |
|---|---|---|---|
| 2012/0019740 A1* | 1/2012 | Kadowaki | G02B 5/201 349/61 |
| 2014/0027798 A1* | 1/2014 | Sato | H10K 71/00 257/89 |

(Continued)

FOREIGN PATENT DOCUMENTS

| CN | 103219357 A | 7/2013 |
|---|---|---|
| CN | 104076549 A | 10/2014 |

(Continued)

OTHER PUBLICATIONS

International Search Report in International application No. PCT/CN2022/086596, mailed on Nov. 30, 2022.

(Continued)

*Primary Examiner* — Jonathan Y Jung
(74) *Attorney, Agent, or Firm* — PV IP PC; Wei Te Chung

(57) ABSTRACT

The application discloses a color filter substrate, a display panel and a display device. The color filter substrate includes a base substrate, a light-shielding portion and a plurality of light-filtering portions. The plurality of light-shielding portions are arranged on the base substrate at intervals, the light-filtering portion is arranged between the plurality of (Continued)

light-shielding portions, the light-filtering portion includes a first light-filtering portion and at least two second light-filtering portions, the first light-filtering portion is arranged between the two second light-filtering portions, the first light-filtering portion includes a color resist material and a high-refractive material, and the at least two second light-filtering portions includes a transparent material.

17 Claims, 3 Drawing Sheets

(51) Int. Cl.
*H10K 59/126* (2023.01)
*H10K 59/38* (2023.01)
*H10K 59/50* (2023.01)
*H10K 59/80* (2023.01)

(52) U.S. Cl.
CPC ..... *G02F 1/133553* (2013.01); *H10K 59/126* (2023.02); *H10K 59/38* (2023.02); *H10K 59/50* (2023.02); *H10K 59/878* (2023.02)

(56) References Cited

U.S. PATENT DOCUMENTS

| | | | |
|---|---|---|---|
| 2019/0196260 A1 | 6/2019 | Zhang et al. | |
| 2021/0104581 A1* | 4/2021 | Fukuoka | H10K 59/352 |
| 2021/0336224 A1* | 10/2021 | Yun | H10K 59/878 |
| 2022/0052296 A1* | 2/2022 | Noh | H10K 59/38 |

FOREIGN PATENT DOCUMENTS

| | | |
|---|---|---|
| CN | 105892125 A | 8/2016 |
| CN | 107024795 A | 8/2017 |
| CN | 207833177 U | 9/2018 |
| CN | 110568654 A | 12/2019 |
| CN | 112786666 A | 5/2021 |
| CN | 113359343 A | 9/2021 |
| CN | 113488496 A | 10/2021 |
| CN | 113764602 A | 12/2021 |
| CN | 114005861 A | 2/2022 |
| JP | 2010127985 A | 6/2010 |
| JP | 2012013745 A | 1/2012 |
| JP | 2013246303 A | 12/2013 |

OTHER PUBLICATIONS

Written Opinion of the International Search Authority in International application No. PCT/CN2022/086596, mailed on Nov. 30, 2022.

Chinese Office Action issued in corresponding Chinese Patent Application No. 202210343228.5 dated Mar. 18, 2023, pp. 1-7.

* cited by examiner

COLOR FILTER SUBSTRATE, DISPLAY PANEL AND DISPLAY DEVICE

FIELD OF INVENTION

The present application relates to a field of display technology, and particularly to a color filter substrate, a display panel and a display device.

BACKGROUND

Flat-panel display devices have many advantages such as thin body, power saving, and no radiation, and have been widely used. Existing flat-panel display devices mainly include liquid crystal displays and organic light emitting diode displays.

At present, due to the reflection, refraction and large-angle total reflection of the light generated inside the flat-panel display device at an interface of each layer, and metal electrodes and organic layers will absorb a certain extent of light, in the end, only about 20% of light is emitted. Therefore, existing flat-panel display device has the problem of low light extraction efficiency.

SUMMARY OF DISCLOSURE

The present application provides a color filter substrate, a display panel and a display device, which can solve the problem of low light extraction efficiency of the display panel.

In a first aspect, embodiments of the present application provide color filter substrate, comprising a base substrate, a plurality of light-shielding portions, and a light-filtering portion. The plurality of light-shielding portions are arranged on the base substrate at intervals and the light-filtering portion is arranged between the plurality of light-shielding portions. The light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprises a transparent material.

Optionally, in some embodiments of the present application, the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

Optionally, in some embodiments of the present application, a refractive index of the first light-filtering portion is greater than a refractive index of the second light-filtering portion.

Optionally, in some embodiments of the present application, the first light-filtering portion comprises a color-resist layer, and a material of the color-resist layer comprises a color-resist material and a high-refractive material doped in the color-resist material.

Optionally, in some embodiments of the present application, the first light-filtering portion comprises a sub color-resist layer and a first high-refractive layer arranged on a side of the sub color-resist layer away from the base substrate, a material of the sub color-resist layer is a color-resist material, and a material of the first high-refractive layer is a high-refractive material; and/or the first light-filtering portion further comprises a second high-refractive layer arranged on a side of the sub color-resist layer close to the base substrate, and a material of the second high-refractive layer is a high-refractive material.

Optionally, in some embodiments of the present application, a refractive index of the first high-refractive layer and a refractive index of the second high-refractive layer are both greater than the refractive index of the sub color-resist layer.

Optionally, in some embodiments of the present application, the refractive index of the first high-refractive layer and the refractive index of the second high-refractive layer are both greater than the refractive index of the base substrate and the refractive index of the filling medium, and the filling medium is a medium filled in the display panel composed of the color filter substrate and a packaging cover plate.

Optionally, in some embodiments of the present application, the refractive indices of the first high-refractive layer and the second high-refractive layer is greater than or equal to 2.2, the refractive index of the base substrate, the refractive index of the first high-refractive layer, and the refractive indices of the at least two second light-filtering portions and the filling medium are all less than or equal to 1.5.

Optionally, in some embodiments of the present application, a shape of a cross-section of the first light-filtering portion along a first direction is a trapezoid, and a shape of a cross-section of the at least two second light-filtering portions along the first direction is an inverted trapezoid.

In another aspect, the present application provides a display panel, comprising an array substrate and a color filter substrate, the array substrate and the color filter substrate are disposed opposite to the color filter substrate, wherein the color filter substrate comprises a base substrate, a plurality of light-shielding portions, and a light-filtering portion. The plurality of light-shielding portions are arranged on the base substrate at intervals and the light-filtering portion is arranged between the plurality of light-shielding portions. The light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprises a transparent material.

Optionally, in some embodiments of the present application, the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

Optionally, in some embodiments of the present application, a refractive index of the first light-filtering portion is greater than a refractive index of the second light-filtering portion.

Optionally, in some embodiments of the present application, the first light-filtering portion comprises a color-resist layer, and a material of the color-resist layer comprises a color-resist material and a high-refractive material doped in the color-resist material.

Optionally, in some embodiments of the present application, the first light-filtering portion comprises a sub color-resist layer and a first high-refractive layer arranged on a side of the sub color-resist layer away from the base substrate, a material of the sub color-resist layer is a color-resist material, and a material of the first high-refractive layer is a high-refractive material; and/or the first light-filtering portion further comprises a second high-refractive layer arranged on a side of the sub color-resist layer close to the base substrate, and a material of the second high-refractive layer is a high-refractive material.

Optionally, in some embodiments of the present application, a refractive index of the first high-refractive layer and a refractive index of the second high-refractive layer are both greater than the refractive index of the sub color-resist layer.

Optionally, in some embodiments of the present application, the refractive index of the first high-refractive layer and the refractive index of the second high-refractive layer are both greater than the refractive index of the base substrate and the refractive index of the filling medium, and the filling medium is a medium filled in the display panel composed of the color filter substrate and a packaging cover plate.

Optionally, in some embodiments of the present application, the refractive indices of the first high-refractive layer and the second high-refractive layer is greater than or equal to 2.2, the refractive index of the base substrate, the refractive index of the first high-refractive layer, and the refractive indices of the at least two second light-filtering portions and the filling medium are all less than or equal to 1.5.

Optionally, in some embodiments of the present application, a shape of a cross-section of the first light-filtering portion along a first direction is a trapezoid, and a particularly shape of a cross-section of the at least two second light-filtering portions along the first direction is an inverted trapezoid.

The present application further provides a display device, comprising a driver chip and a display panel, the driver chip is connected to the display panel, the display panel comprises an array substrate and a color filter substrate, the array substrate and the color filter substrate are disposed opposite to each other, wherein the color filter substrate comprises a base substrate, a plurality of light-shielding portions, and a light-filtering portion. The plurality of light-shielding portions are arranged on the base substrate at intervals and the light-filtering portion is arranged between the plurality of light-shielding portions. The light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprises a transparent material.

Optionally, in some embodiments of the present application, the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

The present application provides a color filter substrate, a display panel and a display device. The color filter substrate includes a base substrate, a light-shielding portion and a plurality of light-filtering portions. The plurality of light-shielding portions are arranged on the base substrate at intervals, the light-filtering portion is arranged between the plurality of light-shielding portions, the light-filtering portion includes a first light-filtering portion and at least two second light-filtering portions, the first light-filtering portion is arranged between the two second light-filtering portions, the first light-filtering portion includes a color resist material and a high-refractive material, and the at least two second light-filtering portions includes a transparent material. Through doping particles with high refractive characteristics into the first light-filtering portion and making the refractive indices of the base substrate and the filling medium lower than the refractive index of the first light-filtering portion, most of the light passing through the filling medium to base substrate can thus form an optical waveguide phenomenon in the first light-filtering portion and an enhanced interference is obtained after continuous reflection and oscillation. The enhanced light propagates into the second light-filtering portion and is reflected and emitted to the base substrate and the air by the first reflection portion and the second reflection portion on the bottom surface and sidewalls of the second light-filtering portion so as to improve the light extraction efficiency of the display panel, thereby reducing the power consumption of the panel and solving the problem of low light output efficiency of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

Herein,
100/200/300/400: color filter substrate;
10: base substrate;
20: light-shielding portion;
30: light-filtering portion;
31: the first light-filtering portion;
32: the second light-filtering portion;
33: the first reflection portion;
34: the second reflection portion;
35: sub color-resist layer;
36: the first high-refractive transparent layer;
37: the second high-refractive transparent layer;
40: filling medium;
50: boxing substrate;
60: pixel limiting layer;
70: light-emitting functional layer; and
500: display panel.

DETAILED DESCRIPTION

Technical solutions in the embodiments of the present application will be clearly and completely described below with reference to the accompanying drawings in the embodiments of the present application. Obviously, the described embodiments are only a portion of the embodiments of the present application, but not all of the embodiments. Based on the embodiments in this application, all other embodiments obtained by those skilled in the art without creative efforts shall fall within the protection scope of this application.

Embodiments of the present application provide a color filter substrate, a display panel and a display device, which can solve the problem of low light extraction efficiency of the existing display panel. Each of them will be described in detail below. It should be noted that the description order of the following embodiments is not intended to limit the preferred order of the embodiments. In addition, in the description of this application, the term "including" means "including but not limited to". The terms "first," "second," "third," etc. are used merely as labels to distinguish between different objects, rather than to describe a particular order.

Figure 1:
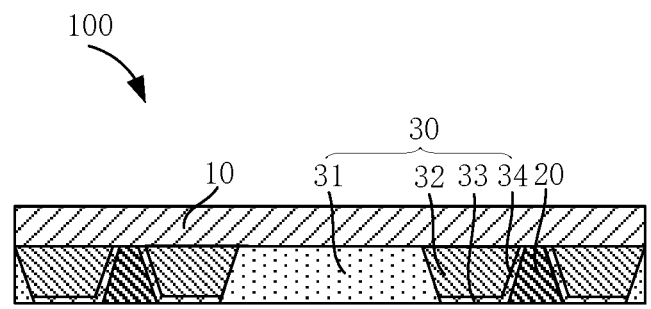
FIG. 1 is a cross-sectional view of a color filter substrate provided in a first embodiment of the present application.
Figure 2:
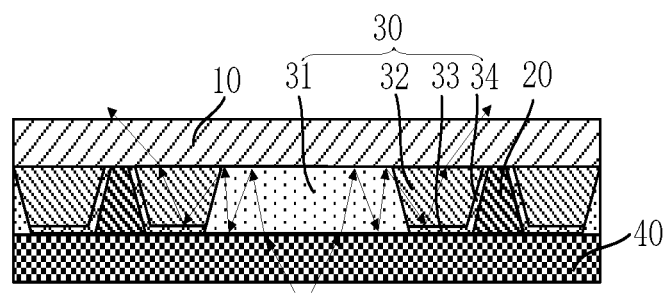
FIG. 2 is a schematic diagram of an optical path of incident light of the color filter substrate provided by the first embodiment of the present application.

Please refer to FIG. 1 and FIG. 2, FIG. 1 is a cross-sectional view of a color filter substrate provided by the first embodiment of the present application, and FIG. 2 is a schematic diagram of an optical path of incident light of the color filter substrate provided by the first embodiment of the present application. As shown in FIG. 1, an embodiment of the present application provides a color filter substrate 100, comprising a base particular substrate 10, a plurality of light-shielding portions 20 and a light-filtering portion 30. The light-shielding portions 20 are arranged on the base particular substrate 10 at intervals, and the light-filtering portion 30 is arranged between the adjacent light-shielding portions 20. The light-filtering portion 30 comprises a first light-filtering portion 31 and at least two second light-filtering portions 32, and the first light-filtering portion 31 is arranged between the two second light-filtering portions 32. Herein, the first light-filtering portion 31 comprises a color-resist material and a high refractive index material, and the second light-filtering portion 32 comprises a transparent material.

In an embodiment of the present application, the color filter substrate is used to form a display panel with an array substrate. The display panel may be an organic light emitting diode display panel or a liquid crystal display panel. The display panel may be filled with a filling medium 40. The filling medium 40 can be a liquid crystal, an encapsulation glue or a low-refractive epoxy resin, etc. A refractive index of the filling medium 40 is less than or equal to 1.5. The color filter substrate is located on a light-emitting side of the display panel, that is, light for display is emitted from the display panel after passing through the color filter substrate.

In an embodiment of the present application, the base substrate 10 may be an insulating base substrate 10 made of colorless and transparent materials such as glass, quartz, ceramics, plastics, etc., or a metal base substrate 10 made of stainless steel, etc. The base substrate 10 can be a single-layer structure or a multi-layer stack structure. Herein, a refractive index of the base particular substrate 10 is less than or equal to 1.5, and specifically a fluoride coating or a multi-refractive index stacking can be performed on a surface of the base substrate 10. The base substrate 10 may be flexible, stretchable, foldable, bendable and/or rollable.

In an embodiment of the present application, as shown in FIG. 2, the first light-filtering portion 31 is a color-resist layer with a single-layer structure, the first light-filtering portion 31 comprises a color-resist material and a high-refractive material, and the color-resist material is doped with particles with high-refractive characteristics, that is, a refractive index of the color-resist material is smaller than a refractive index of the high-refractive material. The particles with high-refractive characteristics can change the direction of light propagation through reflection or refraction, so that a portion of the light passing through the first light-filtering portion 31 is oscillated by the constant reflections, thereby being enhanced by interference. The high-refractive material comprises one or more of particles with high-refractive properties such as titanium dioxide, zinc oxide, and zinc selenide, and the refractive index of the first light-filtering portion 31 is greater than or equal to 2.2.

In the embodiment of the present application, the light-filtering portion 30 further comprises a first reflection portion 33 and a second reflection portion 34. The first reflection portion 33 is provided on a side of the second light-filtering portion 32 away from the base substrate 10, and the second reflection portion 34 is disposed on a side of the second light-filtering portion 32 away from the first light-filtering portion 31. The first reflection portion 33 and the second reflection portion 34 form an obtuse angle, which is beneficial to reflect the light entering the second light-filtering portion 32 to the base substrate 10 and the air, thereby improving an luminous efficiency of the display panel. Thicknesses of the first reflection portion 33 and the second reflection portion 34 can be adjusted according to actual needs, which are not limited in this application.

In an embodiment of the present application, an longitudinal direction of the base substrate 10 is the first direction, a shape of a cross-section of the first light-filtering portion 31 along the first direction is a trapezoid, and a shape of a cross-section of the second light-filtering portion 32 along the first direction is an inverted trapezoid. The shape of the cross-section of the light-shielding portion 20 along the first direction is preferably a trapezoid, and the shape of the cross-section of the light-shielding portion 20 along the first direction may also be a triangle or other regular polygons. Further, the shape of the cross-section of the first light-filtering portion 31 along the first direction and the shape of the cross-section of the light shielding portion 20 along the first direction may also be different. For example, the shape of the cross-section of the first light-filtering portion 31 along the first direction is a trapezoid, and the shape of the cross-section of the light shielding portion 20 along the first direction is a triangle.

In an embodiment of the present application, the second light-filtering portion 32 uses a transparent material, which is beneficial to improve the transmittance of light, and the light-shielding portion 20 uses a black light-shielding material, which plays a light-shielding role and prevents light mixing phenomenon occurred after light passing through the filling medium 40 and the second light-filtering portion 32 and avoids abnormal display. Specifically, lateral widths of the second light-filtering portion 32 and the light-shielding portion 20 can be adjusted according to actual needs, which are not limited in this application, so as to avoid abnormal display caused by color mixing between adjacent second light-filtering portions 32.

In an embodiment of the present application, the refractive index of the first light-filtering portion 31 is greater than the refractive index of the second light-filtering portion 32. Through such structural design, light entering the first light-filtering portion 31 can easier to exit into the base substrate 10 or the air through the second light-filtering portion 32 after continuous reflection and oscillation. That is, when the light is emitted from the first light-filtering portion 31 with a high refractive index to the second light-filtering portion 32 with a low refractive index, it is the same as that light enters an optically thinner medium from an optically denser medium, so the refraction angle is larger than the incident angle and it is easier to exit. By setting the refractive index of the second light-filtering portion 32 to be slightly lower than the refractive index of the first light-filtering portion 31, the transmittance of light can be thus improved.

In the color filter substrate provided by the present application, through doping particles with high refractive characteristics into the first light-filtering portion 31 and making the refractive indices of the base substrate 10 and the filling medium 40 lower than the refractive index of the first light-filtering portion 31, most of the light passing through the filling medium 40 to base substrate 10 can thus form an optical waveguide phenomenon in the first light-filtering portion 31 and an enhanced interference is obtained after continuous reflection and oscillation. The enhanced light propagates into the second light-filtering portion 32 and is reflected and emitted to the base substrate 10 and the air by the first reflection portion 33 and the second reflection portion 34 on the bottom surface and sidewalls of the second light-filtering portion 32 so as to improve the light extraction efficiency of the display panel, thereby reducing the power consumption of the panel and solving the problem of low light output efficiency of the display panel.

Figure 3:
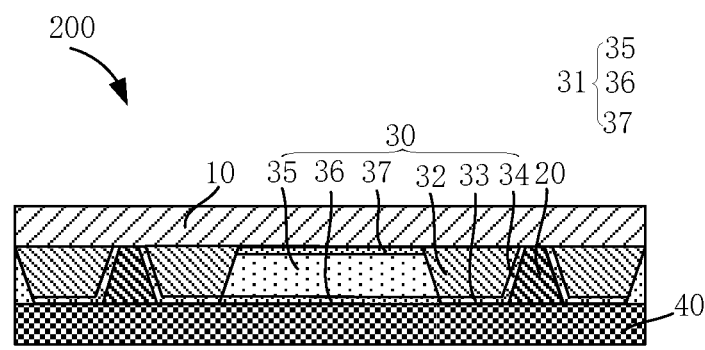
FIG. 3 is a cross-sectional view of a color filter substrate provided in a second embodiment of the present application.
Figure 4:
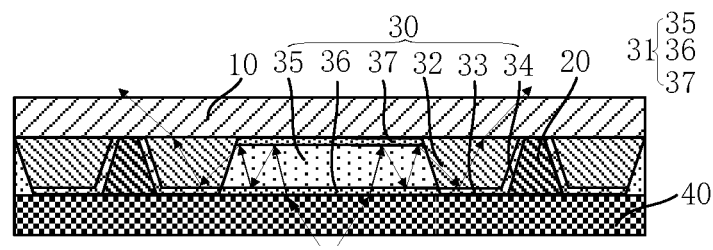
FIG. 4 is a schematic diagram of an optical path of incident light of the color filter substrate provided by the second embodiment of the present application.
Figure 5:
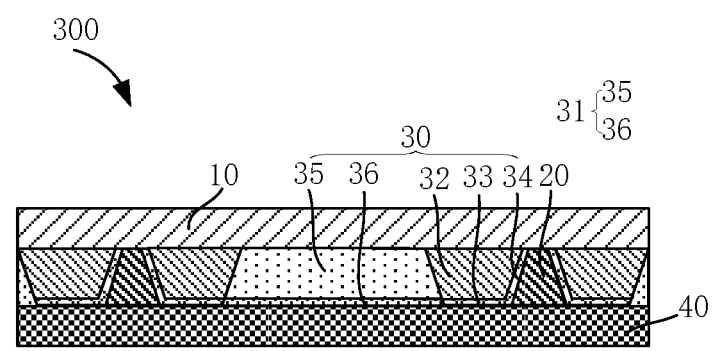
FIG. 5 is a cross-sectional view of a color filter substrate provided by a third embodiment of the present application.
Figure 6:
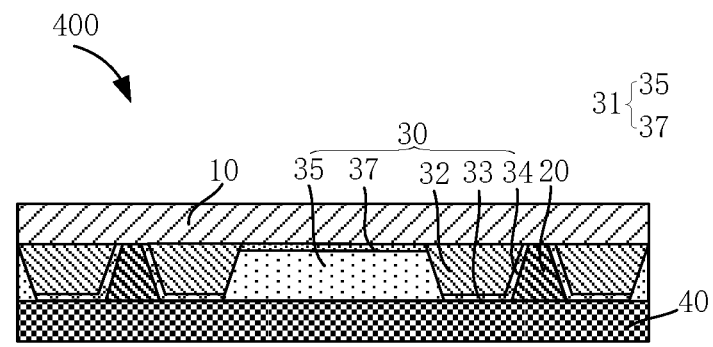
FIG. 6 is a cross-sectional view of a color filter substrate provided in a fourth embodiment of the present application.

As a specific embodiment of the present application, please refer to FIG. 3 to FIG. 6. FIG. 3 is a cross-sectional view of a color filter substrate provided in a second embodiment of the present application, FIG. 4 is a schematic diagram of an optical path of incident light of the color filter substrate provided by the second embodiment of the present application, FIG. 5 is a cross-sectional view of a color filter substrate provided by a third embodiment of the present application, and FIG. 6 is a cross-sectional view of a color filter substrate provided in a fourth embodiment of the present application. As shown in FIG. 3, an embodiment of the present application provides a color filter substrate 200. The color filter substrate 200 is an modification based on the color filter substrate 100. The difference between the color filter substrate 200 and the color filter substrate 100 is that the first light-filtering portion 31 of the color filter substrate 200 is a multi-layer structure comprising a sub color-resist layer 35 formed of a color-resist material and a first high-refractive layer 36 disposed on a side of the sub color-resist layer 35 away from the base substrate 10. A material of the sub color-resist layer 35 is a color-resist material, and the material of the first high-refractive layer 36 is a high-refractive material, and/or, the first light-filtering portion 31 further comprises a second high-refractive layer 37 on a side of the sub color-resisting layer 35 close to the base substrate 10, and a material of the second high-refractive layer 37 is a high-refractive material.

In the embodiment of the present application, as shown in FIG. 3, the first light-filtering portion 31 comprises the sub color-resist layer 35, the first high-refractive layer 36 and the second high-refractive layer 37. The first high-refractive layer 36 is provided on the on the side of the sub color-resist layer 35 away from the base substrate 10, and the second high refractive layer 37 is disposed on the side of the sub-color resist layer 35 close to the base substrate 10. Specifically, the first high-refractive layer 36 and the second high-refractive layer 37 are respectively formed on the side of the sub-color resist layer 35 away from the base substrate 10 and the side close to the base substrate 10 by evaporation, photolithography and other processes.

In an embodiment of the present application, the materials of the first high-refractive layer 36 and the second high-refractive layer 37 comprise one or more of zinc selenide or zinc sulfide, which can form a film layer through processes such as evaporation or photolithography and have high-refractive properties.

In an embodiment of the present application, the base substrate 10 may be an insulating base substrate 10 made of colorless and transparent materials such as glass, quartz, ceramics, plastics, etc., or a metal base substrate 10 made of stainless steel, etc. The base substrate 10 can be a single-layer structure or a multi-layer stack structure. Herein, the refractive index of the base substrate 10 is less than or equal to 1.5, specifically, a fluoride coating or multi-refractive index stacking can be formed on the surface of the base substrate 10. The base substrate 10 may be flexible, stretchable, foldable, bendable and/or rollable.

In the embodiment of the present application, the refractive indices of the first high-refractive layer 36 and the second high-refractive layer 37 are greater than the refractive indices of the base substrate 10 and the filling medium 40, and the filling medium 40 is a medium filled in the display composed of the color filter substrate and the array substrate. Specifically, the refractive indices of the first high-refractive layer 36 and the second high-refractive layer 37 are greater than or equal to 2.2, and the refractive indices of the base substrate 10 and the filling medium 40 are both less than or equal to 1.5.

In an embodiment of the present application, the light-filtering portion 30 further comprises a first reflection portion 33 and a second reflection portion 34, the first reflection portion 33 is provided on a side of the second light-filtering portion 32 away from the base substrate 10, and the second reflection portion 34 is disposed on a side of the second light-filtering portion 32 away from the first light-filtering portion 31. The first reflection portion 33 and the second reflection portion 34 form an obtuse angle, which is beneficial to reflect the light entering the second light-filtering portion 32 to the base substrate 10 and the air, thereby improving the luminous efficiency of the display panel. Thicknesses of the first reflection portion 33 and the second reflection portion 34 can be adjusted according to actual needs, which are not limited in this application.

In an embodiment of the present application, an longitudinal direction of the base substrate 10 is the first direction, a shape of a cross-section of the first light-filtering portion 31 along the first direction is a trapezoid, and a shape of a cross-section of the second light-filtering portion 32 along the first direction is an inverted trapezoid. The shape of the cross-section of the light-shielding portion 20 along the first direction is preferably a trapezoid, and the shape of the cross-section of the light-shielding portion 20 along the first direction may also be a triangle or other regular polygons. Further, the shape of the cross-section of the first light-filtering portion 31 along the first direction and the shape of the cross-section of the light shielding portion 20 along the first direction may also be different. For example, the shape of the cross-section of the first light-filtering portion 31 along the first direction is a trapezoid, and the shape of the cross-section of the light shielding portion 20 along the first direction is a triangle.

In an embodiment of the present application, the second light-filtering portion 32 uses a transparent material, which is beneficial to improve the transmittance of light, and the light-shielding portion 20 uses a black light-shielding material, which plays a light-shielding role and prevents light mixing phenomenon occurred after light passing through the filling medium 40 and the second light-filtering portion 32 and avoids abnormal display. Specifically, lateral widths of the second light-filtering portion 32 and the light-shielding portion 20 can be adjusted according to actual needs, which are not limited in this application, so as to avoid abnormal display caused by color mixing between adjacent second light-filtering portions 32.

In an embodiment of the present application, as shown in FIG. 4, the refractive indices of the first high-refractive layer 36 and the second high-refractive layer 37 are greater than the refractive indices of the base substrate 10, the sub color-resist layer 35 and the filling medium 40, so that most of the light that is emitted to the base substrate 10 through the filling medium 40 forms an optical waveguide phenomenon in the first light-filtering portion 31. Due to the reflection of the first high-refractive layer 36 and the second high-refractive layer 37, most of the light in the first light-filtering portion 31 undergoes constant reflection and oscillation, thereby obtaining an enhanced interference, and enhanced light propagates to the second light-filtering portion 32 and is then reflected by the first reflection portion 33 and the first reflection portion 33 on the bottom surface and the sidewalls of the second light-filtering portion 32 emits to the base substrate 10 and the air, thereby improving the light extraction efficiency of the display panel, reducing the power consumption of the display panel, and solving the problem of low light extraction efficiency of the display panel.

In an embodiment of the present application, as shown in FIG. 5, the first light-filtering portion 31 in the color filter substrate 300 is a double-layer structure, comprising a sub color-resist layer 35 formed of a color-resist material and the high-refractive layer 36 formed of a high-refractive material. The first high-refractive layer 36 is disposed on the side of the sub color-resist layer 35 away from the base substrate 10.

In the embodiment of the present application, as shown in FIG. 6, the first light-filtering portion 31 in the color filter substrate 400 is also a double-layer structure, comprising a sub color-resist layer 35 formed of a color-resist material and a first light-filtering portion formed of a high-refractive material. The second high-refractive layer 37 is disposed between the sub color-resist layer 35 and the base substrate 10.

In an color filter substrate provided by the present application, through arranging the first high-refractive layer 36 and/or the second high-refractive layer 37 formed of the high refractive material on at least one of the upper and lower sides of the sub color-resist layer 35 formed of the color resistance material and making the refractive index of the base substrate 10 and the filling medium 40 lower than the refractive index of the first light-filtering portion 31 at the same time, so that most of the light passing through the filling medium 40 to the base substrate 10 is formed with an optical waveguide phenomenon in the first light-filtering portion 31. After continuous reflection and oscillation, an enhanced interference is obtained and the enhanced light propagates into the second light-filtering portion 32 and is then reflected by the first reflection portion 33 and the second light-filtering portion 32 on the bottom and sidewalls of the second light-filtering portion 32 and emits to the base substrate 10 and the air, thereby improving the light extraction efficiency of the display panel, reducing the power consumption of the display panel, and solving the problem of low light extraction efficiency of the display panel.

Figure 7:
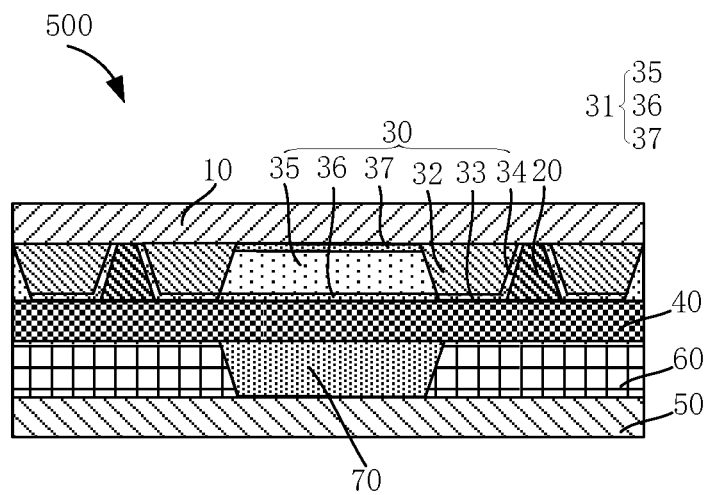
FIG. 7 is a cross-sectional view of a display panel provided by an embodiment of the present application.
Figure 8:
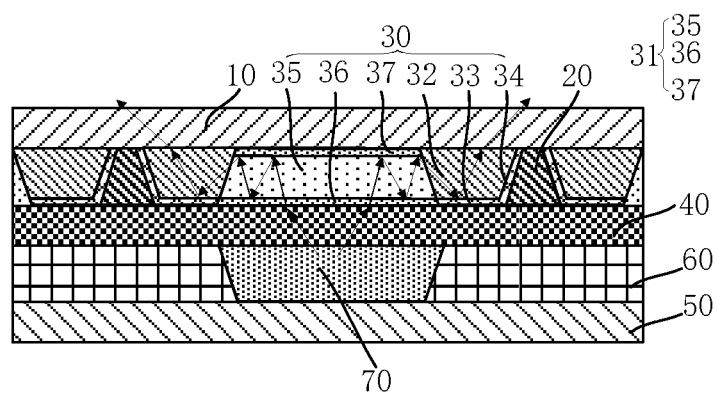
FIG. 8 is a schematic diagram of an optical path of a display panel provided by an embodiment of the present application.

On the other hand, please refer to FIG. 7 and FIG. 8, FIG. 7 is a cross-sectional view of a display panel provided by an embodiment of the present application, and FIG. 8 is a schematic diagram of an optical path of a display panel provided by an embodiment of the present application. As shown in FIG. 7, the present application provides a display panel 500 comprising the above-mentioned color filter substrate, an array substrate, and the filling medium 40. The array substrate and the color filter substrate are disposed opposite to each other, and the filling medium 40 is filled between the array substrate and the color filter substrate.

In an embodiment of the present application, the array substrate comprises a substrate 50, a pixel defining layer 60, and a light-emitting functional layer 70. The pixel defining layer 60 is disposed on a side of the substrate 50 close to the color filter substrate, and the pixel defining layer 60 has a plurality of openings. The position of the plurality of openings corresponds to first light-filtering portion 31 in the color filter substrate one by one, and the light-emitting functional layer 70 is disposed at the openings.

In the embodiment of the present application, the first light-filtering portion 31 comprises a sub color-resist layer 35, a first high-refractive layer 36 and a second high-refractive layer 37. Herein, the first high-refractive layer 36 is disposed on a side of the sub color-resist layer 35 away from the base substrate 10, and the second high refractive layer 37 is disposed on a side of the sub color-resist layer 35 close to the base substrate 10. Specifically, the first high-refractive layer 36 and the second high-refractive layer 37 are respectively formed on the side of the sub color-resist layer 35 away from the base substrate 10 and the side close to the base substrate 10 by evaporation, photolithography and other processes.

In the embodiment of the present application, the materials of the first high-refractive layer 36 and the second high-refractive layer 37 comprises one or more of zinc selenide or zinc sulfide, which can form a film layer through processes such as evaporation or photolithography and have high-refractive properties.

In the embodiment of the present application, the base substrate 10 may be an insulating base substrate 10 made of colorless and transparent materials such as glass, quartz, ceramics, plastics, etc., or a metal base substrate 10 made of stainless steel, etc. The base substrate 10 can be a single-layer structure or a multi-layer stack structure. Herein, the refractive index of the base substrate 10 is less than or equal to 1.5. Specifically, a fluoride coating or multi-refractive index stacking can be formed on the surface of the base substrate 10. The base substrate 10 may be flexible, stretchable, foldable, bendable and/or rollable.

In the embodiment of the present application, the light-filtering portion 30 further comprises a first reflection portion 33 and a second reflection portion 34. The first reflection portion 33 is provided on a side of the second light-filtering portion 32 away from the base substrate 10, and the second reflection portion 34 is disposed on a side of the second light-filtering portion 32 away from the first light-filtering portion 31. The first reflection portion 33 and the second reflection portion 34 form an obtuse angle, which is beneficial to reflect the light entering the second light-filtering portion 32 to the base substrate 10 and the air, thereby improving an luminous efficiency of the display panel. Thicknesses of the first reflection portion 33 and the second reflection portion 34 can be adjusted according to actual needs, which are not limited in this application.

In an embodiment of the present application, an longitudinal direction of the base substrate 10 is the first direction, a shape of a cross-section of the first light-filtering portion 31 along the first direction is a trapezoid, and a shape of a cross-section of the second light-filtering portion 32 along the first direction is an inverted trapezoid. The shape of the cross-section of the light-shielding portion 20 along the first direction is preferably a trapezoid, and the shape of the cross-section of the light-shielding portion 20 along the first direction may also be a triangle or other regular polygons. Further, the shape of the cross-section of the first light-filtering portion 31 along the first direction and the shape of the cross-section of the light shielding portion 20 along the first direction may also be different. For example, the shape of the cross-section of the first light-filtering portion 31 along the first direction is a trapezoid, and the shape of the cross-section of the light shielding portion 20 along the first direction is a triangle.

In an embodiment of the present application, the second light-filtering portion 32 uses a transparent material, which is beneficial to improve the transmittance of light, and the light-shielding portion 20 uses a black light-shielding material, which plays a light-shielding role and prevents light mixing phenomenon occurred after light passing through the filling medium 40 and the second light-filtering portion 32 and avoids abnormal display. Specifically, lateral widths of the second light-filtering portion 32 and the light-shielding portion 20 can be adjusted according to actual needs, which are not limited in this application, so as to avoid abnormal display caused by color mixing between adjacent second light-filtering portions 32.

In this embodiment of the present application, as shown in FIG. 8, due to the refractive indices of the first high-refractive layer 36 and the second high-refractive layer 37 are greater than the refractive indices of the base occurred substrate 10, the sub-color resist layers 35 and the filling medium 40, so that most of the light emitted to the base substrate 10 through the filling medium 40 forms an optical waveguide phenomenon in the first light-filtering portion 31. Due to the reflection of the first high-refractive layer 36 and the second high-refractive layer 37, most of the light in the first light-filtering portion 31 undergoes constant reflection and oscillation, thereby obtaining an enhanced interference. The enhanced light propagates to the second light-filtering portion 32, and is then reflected by the first reflection portion 33 and the first reflection portion 33 on the bottom and side walls of the second light-filtering portion 32 and the second reflection portion 34 and emits to the base substrate 10 and the air, thereby improving the light extraction efficiency of the display panel, reducing the power consumption of the display panel, and solving the problem of low light extraction efficiency of the display panel.

The present application also provides a display device, which comprises a driver chip and the above-mentioned display panel. Herein, the driver chip is electrically connected to the display panel for transmitting a control signal to the display panel.

The display device can be any product or component with display function, such as electronic paper, mobile phone, tablet computer, television, monitor, notebook computer, digital photo frame, and navigator.

A color filter substrate, a display panel, and a display device provided by the embodiments of the present application have been introduced in detail above. Specific examples are used in this article to illustrate the principles and implementations of the present application. The description of the above embodiments is only used to help understand the present application The method of application and its core idea; meanwhile, for those skilled in the art, according to the idea of this application, there will be changes in the specific implementation and the scope of application. In summary, the content of this specification should not be understood as Restrictions on this application.

What is claimed is:

1. A color filter substrate, comprising:
a base substrate;
a plurality of light-shielding portions, wherein the plurality of light-shielding portions are arranged on the base substrate at intervals; and
a light-filtering portion, wherein the light-filtering portion is arranged between the plurality of light-shielding portions, the light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprise a transparent material;
wherein the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

2. The color filter substrate of claim 1, wherein a refractive index of the first light-filtering portion is greater than a refractive index of the second light-filtering portion.

3. The color filter substrate according to claim 2, wherein the first light-filtering portion comprises a color-resist layer, and a material of the color-resist layer comprises a color-resist material and a high-refractive material doped in the color-resist material.

4. The color filter substrate of claim 2, wherein the first light-filtering portion comprises a sub color-resist layer and a first high-refractive layer arranged on a side of the sub color-resist layer away from the base substrate, a material of the sub color-resist layer is a color-resist material, and a material of the first high-refractive layer is a high-refractive material; and/or
the first light-filtering portion further comprises a second high-refractive layer arranged on a side of the sub color-resist layer close to the base substrate, and a material of the second high-refractive layer is a high-refractive material.

5. The color filter substrate according to claim 4, wherein a refractive index of the first high-refractive layer and a refractive index of the second high-refractive layer are both greater than a refractive index of the sub color-resist layer.

6. The color filter substrate according to claim 5, wherein the refractive index of the first high-refractive layer and the refractive index of the second high-refractive layer are both greater than a refractive index of the base substrate and a refractive index of a filling medium, and the filling medium is a medium filled in the display panel composed of the color filter substrate and a packaging cover plate.

7. The color filter substrate according to claim 6, wherein the refractive indices of the first high-refractive layer and the second high-refractive layer are greater than or equal to 2.2, the refractive index of the base substrate, the refractive index of the first high-refractive layer, and the refractive indices of the at least two second light-filtering portions and the filling medium are all less than or equal to 1.5.

8. The color filter substrate according to claim 1, wherein a shape of a cross-section of the first light-filtering portion along a first direction is a trapezoid, and an occurred shape of a cross-section of the at least two second light-filtering portions along the first direction is an inverted trapezoid.

9. A display panel, comprising an array substrate and a color filter substrate, the array substrate and the color filter substrate are disposed opposite to the color filter substrate, wherein the color filter substrate comprises:
- a base substrate;
- a plurality of light-shielding portions, wherein the plurality of light-shielding portions are arranged on the base substrate at intervals; and
- a light-filtering portion, wherein the light-filtering portion is arranged between the plurality of light-shielding portions, the light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprise a transparent material;
- wherein the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

10. The display panel according to claim 9, wherein a refractive index of the first light-filtering portion is greater than a refractive index of the second light-filtering portion.

11. The display panel according to claim 10, wherein the first light-filtering portion comprises a color-resist layer, and a material of the color-resist layer comprises a color-resist material and a high-refractive material doped in the color-resist material.

12. The display panel according to claim 10, wherein the first light-filtering portion comprises a sub color-resist layer and a first high-refractive layer arranged on a side of the sub color-resist layer away from the base substrate, a material of the sub color-resist layer is a color-resist material, and a material of the first high-refractive layer is a high-refractive material; and/or
the first light-filtering portion further comprises a second high-refractive layer arranged on a side of the sub color-resist layer close to the base substrate, and a material of the second high-refractive layer is a high-refractive material.

13. The display panel according to claim 12, wherein a refractive index of the first high-refractive layer and a refractive index of the second high-refractive layer are both greater than a refractive index of the sub color-resist layer.

14. The display panel according to claim 13, wherein the refractive index of the first high-refractive layer and the refractive index of the second high-refractive layer are both greater than a refractive index of the base substrate and a refractive index of a filling medium, and the filling medium is a medium filled in the display panel composed of the color filter substrate and a packaging cover plate.

15. The display panel according to claim 14, wherein the refractive indices of the first high-refractive layer and the second high-refractive layer are greater than or equal to 2.2, the refractive index of the base substrate, the refractive index of the first high-refractive layer, and the refractive indices of the at least two second light-filtering portions and the filling medium are all less than or equal to 1.5.

16. The display panel according to claim 9, wherein a shape of a cross-section of the first light-filtering portion along a first direction is a trapezoid, and an occurred shape of a cross-section of the at least two second light-filtering portions along the first direction is an inverted trapezoid.

17. A display device, comprising a driver chip and a display panel, the driver chip is connected to the display panel, the display panel comprises an array substrate and a color filter substrate, the array substrate and the color filter substrate are disposed opposite to each other, wherein the color filter substrate comprises:
- a base substrate;
- a plurality of light-shielding portions, wherein the plurality of light-shielding portions are arranged on the base substrate at intervals; and
- a light-filtering portion, wherein the light-filtering portion is arranged between the plurality of light-shielding portions, the light-filtering portion comprises a first light-filtering portion and at least two second light-filtering portions, the first light-filtering portion is arranged between the two second light-filtering portions, the first light-filtering portion comprises a color resist material and a high-refractive material, and the at least two second light-filtering portions comprise a transparent material;
wherein the light-filtering portion further comprises a first reflection portion and a second reflection portion, the first reflection portion is arranged on a side of the second light-filtering portion away from the base substrate, and the second reflection portion is arranged on a side of the second light-filtering portion away from the first light-filtering portion.

* * * * *